US012127356B2

(12) United States Patent
Scanlan et al.

(10) Patent No.: US 12,127,356 B2
(45) Date of Patent: Oct. 22, 2024

(54) COMPONENT PORT FLUID DRAIN

(71) Applicant: Google LLC, Mountain View, CA (US)

(72) Inventors: James McGregor Scanlan, San Francisco, CA (US); Alan Luu, San Francisco, CA (US); Dennis McCray, San Diego, CA (US); Chang Wei Tsao, New Taipei (TW); Renato Cabanban, San Diego, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 17/665,172

(22) Filed: Feb. 4, 2022

(65) Prior Publication Data

US 2023/0217605 A1 Jul. 6, 2023

Related U.S. Application Data

(60) Provisional application No. 63/294,885, filed on Dec. 30, 2021.

(51) Int. Cl.
| | | |
|---|---|---|
| *H05K 5/02* | (2006.01) | |
| *G04G 21/02* | (2010.01) | |
| *G06F 1/16* | (2006.01) | |
| *H05K 5/00* | (2006.01) | |
| *G04G 17/08* | (2006.01) | |

(52) U.S. Cl.
CPC .......... *H05K 5/0213* (2013.01); *G04G 21/02* (2013.01); *G06F 1/163* (2013.01); *H05K 5/0086* (2013.01); *G04G 17/08* (2013.01)

(58) Field of Classification Search
CPC .... H05K 5/0213; H05K 5/0086; G04G 21/02; G04G 9/007; G04G 17/08; H04R 1/08; H04R 1/086; G01C 5/06
See application file for complete search history.

(56) References Cited

U.S. PATENT DOCUMENTS

| | | | |
|---|---|---|---|
| 9,408,009 B1 | 8/2016 | Witte | |
| 9,939,783 B2 * | 4/2018 | Hilario | G04B 37/00 |
| 10,165,694 B1 * | 12/2018 | Werner | H04R 1/028 |
| 10,531,586 B2 * | 1/2020 | Yoon | H05K 5/0017 |
| 10,562,761 B2 * | 2/2020 | Sooriakumar | H04R 19/04 |
| 10,587,942 B1 * | 3/2020 | Minervini | B81B 7/0038 |
| 10,613,485 B2 * | 4/2020 | Rothkopf | A61B 5/0261 |
| 10,620,591 B2 * | 4/2020 | Rothkopf | A61B 5/02416 |
| 10,627,783 B2 * | 4/2020 | Rothkopf | A61B 5/02416 |
| 10,782,742 B1 * | 9/2020 | Spencer | G06F 1/163 |
| 10,837,772 B2 * | 11/2020 | MacNeil | G01L 19/0654 |
| 10,942,491 B2 * | 3/2021 | Rothkopf | A61B 5/0261 |
| 11,334,032 B2 * | 5/2022 | Liang | G04G 17/04 |
| 2004/0213426 A1 | 10/2004 | MacRae | |
| 2014/0029782 A1 | 1/2014 | Rayner | |

(Continued)

*Primary Examiner* — Abhishek M Rathod
(74) *Attorney, Agent, or Firm* — DORITY & MANNING P.A.

(57) ABSTRACT

The present disclosure provides a wearable device capable of evacuating fluids. The wearable device includes a component with an aperture, a bae port, and a bypass port. The base port extends outward from the aperture of the component to define a first opening on the wearable device. The bypass port extends outward from the base port to define a second opening on the wearable device. The present disclosure also provides methods for manufacturing a wearable device capable of evacuating fluids.

19 Claims, 5 Drawing Sheets

(56) References Cited

U.S. PATENT DOCUMENTS

| | | |
|---|---|---|
| 2014/0307909 A1 | 10/2014 | Yang et al. |
| 2015/0163572 A1 | 6/2015 | Weiss et al. |
| 2015/0304753 A1 | 10/2015 | Loeppert et al. |
| 2016/0037243 A1* | 2/2016 | Lippert ............... H04R 1/023 381/166 |
| 2016/0378142 A1* | 12/2016 | Cardinali ............. H04R 1/00 361/679.56 |
| 2017/0086321 A1* | 3/2017 | de Jong ............ H05K 5/0213 |
| 2017/0157573 A1* | 6/2017 | Mori ................... B01D 71/36 |
| 2018/0084324 A1* | 3/2018 | Vitt ..................... H04R 9/025 |
| 2019/0072903 A1* | 3/2019 | Park .................... G04B 37/08 |
| 2020/0073338 A1* | 3/2020 | Liang .................. G04G 21/08 |
| 2020/0080775 A1* | 3/2020 | Argyres ................ F26B 3/28 |
| 2020/0080908 A1* | 3/2020 | Nyland ............ G01L 19/0672 |
| 2020/0107096 A1* | 4/2020 | Minervini ........... B81B 7/0006 |
| 2021/0259589 A1* | 8/2021 | Ritsher ................ A61B 5/746 |
| 2021/0260271 A1* | 8/2021 | Locke .................. A61M 1/962 |
| 2022/0286539 A1* | 9/2022 | Stobbe ............... H04R 1/2896 |

\* cited by examiner

COMPONENT PORT FLUID DRAIN

RELATED APPLICATIONS

This application claims priority to and the benefit of U.S. Provisional Patent Application No. 63/294,885, filed Dec. 30, 2021. U.S. Provisional Patent Application No. 63/294,885 is hereby incorporated by reference in its entirety.

FIELD

The present disclosure relates generally to a wearable device capable of evacuating fluids. More particularly, the present disclosure relates to a wearable device with a bypass port capable of evacuating fluids from the wearable device and methods of manufacturing said wearable device.

BACKGROUND

Recent advances in technology, including those available through consumer devices, have provided for corresponding advances in health detection and monitoring. For example, wearable devices, such as fitness trackers and smart watches, are able to determine information relating to a person wearing the device or the environment surrounding the device. In addition, the wearable device is able to output a signal to the user based on either the input of the user, the configuration of the wearable device, or the environment surrounding the wearable device.

Such wearable devices generally have component features such as a microphone, an altimeter, and/or any other sensor, which are placed within the wearable device. A port is typically placed adjacent to these features which, for example, allows for a microphone to sense or output acoustics in the area outside of the wearable device or for an altimeter to take readings of outside atmospheric pressure to display for a user. However, although the outside access port provides benefits to the user, the port also allows for fluids to enter the wearable device through the outside access port.

To prevent this fluid from destroying the microphone, the altimeter, and/or other sensor, a fluid impermeable membrane is typically placed at the interface to the component hole. This results in the formation of an air pocket in the component. When fluids enter the port through vigorous immersion, trapped fluids cannot simply drain out because the trapped air would need to expand in order for the fluid to fall out. The force balance means that some fluid is retained until it evaporates, which can take on the order of hours.

Thus, it would be desirable to have wearable device capable of evacuating the trapped fluids in a timely manner. It would also be beneficial for the device to be capable of evacuating the trapped fluids passively without the need of input from the user.

SUMMARY

Aspects and advantages of embodiments of the present disclosure will be set forth in part in the following description, or can be learned from the description, or can be learned through practice of the embodiments.

One example aspect of the present disclosure is directed to a wearable device capable of passively evacuating fluids. The wearable device includes a component with an aperture, a base port, and a bypass port. The base port extends outward from the aperture of the component to define a first opening on the wearable device. The bypass port extends outward from the base port to define a second opening on the wearable device.

Another aspect of the present disclosure is directed to the wearable device where the base port is centered radially around the aperture of the component.

Yet another aspect of the present disclosure is directed to the wearable device of where the component comprises a microphone, or altimeter, or a combination thereof.

Still another aspect of the present disclosure is directed to the wearable device further including a fluid impermeable membrane positioned adjacent the aperture.

In a further aspect, the present disclosure is directed to the wearable device where the base port has a height H1 and the bypass port has a height H2, where the height H2 is less than the height H1.

In yet a further aspect, the present disclosure is directed to the wearable device where the height H1 is greater than or equal to about 0.5 millimeters (mm).

In still a further aspect, the present disclosure is directed to the wearable device where the height H2 is less than about 0.3 millimeters (mm).

In another aspect, the present disclosure is directed to the wearable device where the second opening of the bypass port is positioned on a button of the wearable device.

In yet another aspect, the present disclosure is directed to the wearable device where the wearable device further includes an intermediary port. Moreover, the intermediary port extends outwardly from the aperture of the component. Further, the base port and the bypass port extend outwardly from the intermediary port to define the first opening and the second opening.

In still another aspect, the present disclosure is directed to the wearable device where the intermediary port is centered radially around the aperture of the component.

In another embodiment, the present disclosure is directed to a method for manufacturing a wearable device capable of passively evacuating fluids. The method includes providing a wearable device which has a component with an aperture therein, forming a base port, and forming a bypass port. Further, the base port extends outward from the aperture of the component to define a first opening on the wearable device. Further, the bypass port extends outward from the base port to define a second opening on the wearable device.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

Figure 1:
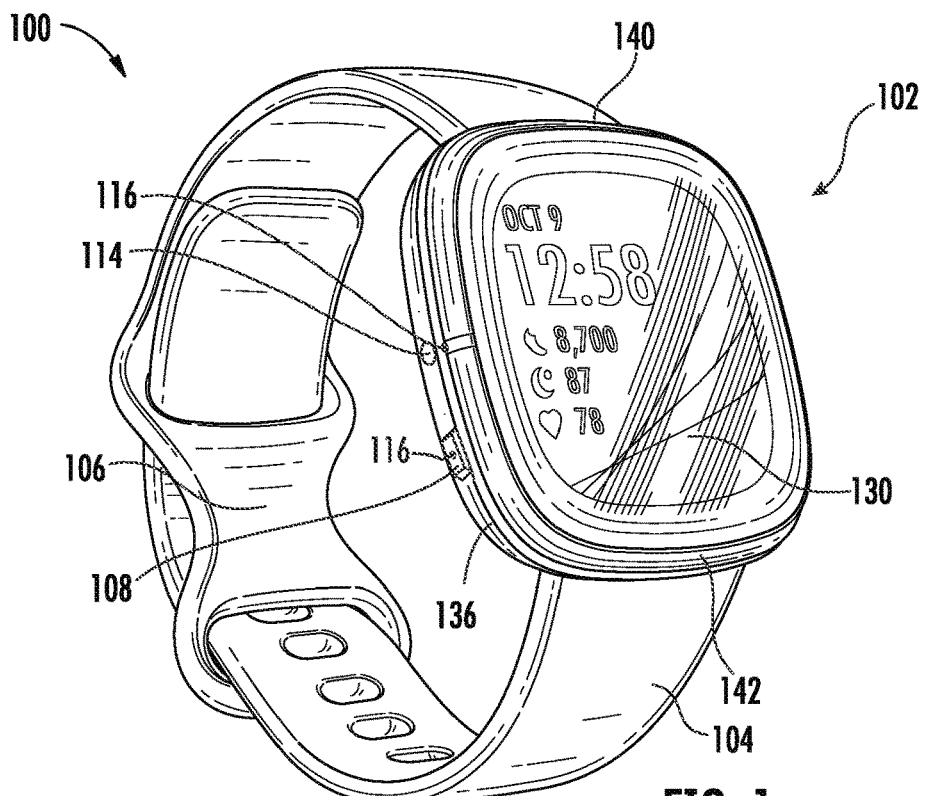
FIG. 1 provides a perspective view of a wearable device according to the present disclosure, particularly showing the front and first side of the wearable device.

Reference numerals that are repeated across plural figures are intended to identify the same features in various implementations.

DETAILED DESCRIPTION

Any of the features, components, or details of any of the arrangements or embodiments disclosed in this application, including without limitation any of the wearable device embodiments and any of the methods of manufacturing said wearable device disclosed below, are interchangeably combinable with any other features, components, or details of any of the arrangements or embodiments disclosed herein to form new arrangements and embodiments.

Generally, the present disclosure is related to a wearable device capable of evacuating fluids. The wearable device includes a component, a base port, and a bypass port. The component has an aperture. The base port extends outward from the aperture of the component to define a first opening on the wearable device. The bypass port extends outward from the base port to define a second opening on the wearable device.

In particular, the wearable device can be a wristwatch, smart watch, smart jewelry, fitness tracker, head mounted display, or any other type of device capable of being worn. Further, in some embodiments, the wearable device's base port allows for the output of audio and the influx of air resulting from atmospheric pressure which may be used for readings from a device such as an altimeter, although it should be understood that the base port is not specifically limited to any particular sensor or electronic component and can be utilized in conjunction with any sensor or electronic component. However, in such embodiments, an air gap may be formed in the base port which can cause fluids to be trapped inside if the wearable device is immersed in a fluid. Yet, the bypass port allows for the influx of air resulting from atmospheric pressure which acts upon the air gap in the base port forming a suction pressure which can expel fluids trapped within the base port. As such, the bypass port allows for the evacuation of fluids to be passive without requiring the input of the user unlike conventional devices which can require the user to initiate a setting on the wearable device for the wearable device to begin to evacuate fluids trapped therein.

With reference now to the figures, example embodiments of the present disclosure will be discussed in further detail. First, the components of the wearable device will be discussed, followed by the means in which fluids may be evacuated from said wearable device.

Figure 2:
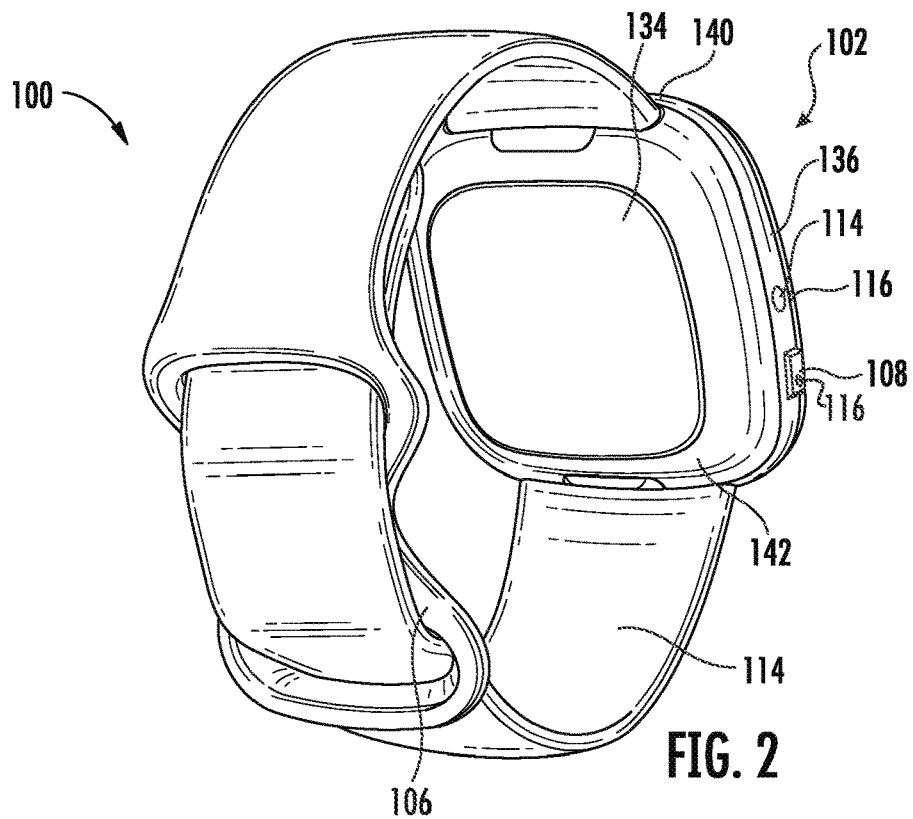
FIG. 2 provides an alternative perspective view of a wearable device according to the present disclosure, particularly showing the back and first side of the wearable device.
Figure 3:
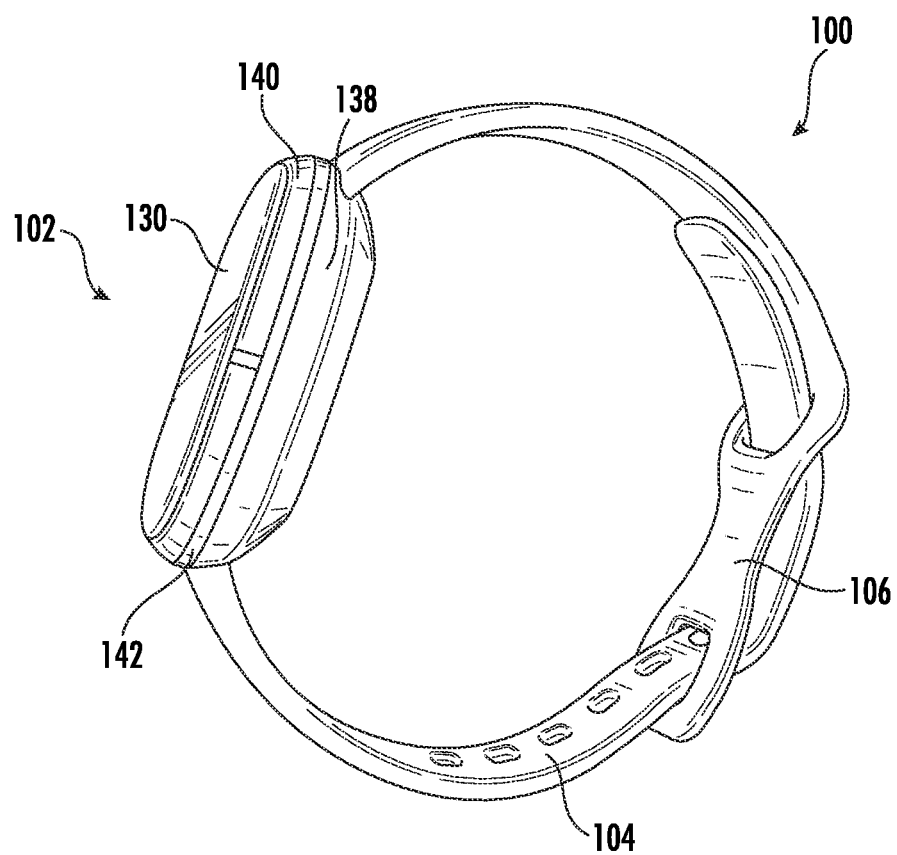
FIG. 3 provides side view of a wearable device according to the present disclosure.

FIGS. 1-3 show a wearable device according to one exemplary embodiment of the present disclosure. The wearable device 100 includes a display 102, an attachment means 104, a securement means 106, a button 108 located on a side of the wearable device 100, a base port 114, and a bypass port 116. Without intending to limit the present disclosure to a particular configuration, the two sides of the display 102 may be connected to the attachment means 104. The securement means 106 may be placed on the attachment means 104. Further, the securement means 106 may be placed opposite of the display 102 on an opposing end of the attachment means 104. The button 108 may be placed on at least one of the sides of the wearable device 100, underneath the display 102. The base port 114 may also be placed on at least one of the sides of the wearable device with the bypass port 116 adjacent to the base port 114.

The display 102 may be capable of providing the wearer with a variety of information such as the time, the date, body signals, readings based upon user input, etc. Body signals may include, but are not limited to, heart rate, heart pressure, temperature, oxygen levels, or any other body signal that one of ordinary skill in the art would understand that can be measured by a wearable device 100. Readings based upon user input may include, but are not limited to, the number of steps a user has taken, the distance traveled by the user, the sleep schedule of the user, travel routes of the user, elevation climbed by the user, or any other metric that one of ordinary skill in the art would understand that can be gathered into a wearable device 100. Further, either body signals or readings based upon user input may be used to calculate further analytics to provide to the user such as a fitness score, a sleep quality score, the number of calories a user has burned. Moreover, the wearable device 100 may also be capable of taking in outside input irrespective of the user such as ambient teacher in the environment, the amount of sun exposure the watch is subjected to, the atmospheric pressure of the environment, air quality of the environment, the location of the wearable device 100 based on a global positioning system (GPS), or other outside factors that one of ordinary skill in the art would understand a wearable device 100 would be capable of measuring.

The attachment means 104 may be capable of attaching the wearable device 100 to a user of said wearable device 100. The attachment means 104 may take the form of, but should not be construed as limited to, a strap, a rope, an elastic band, or any other form of attachment one of ordinary skill in the art would use to attach a wearable device 100 to a user of said wearable device 100.

The securement means 106 may be capable of improving the attachment of the attachment means 104 upon the user. The securement means 106 may include, but should not be construed as limited to, a pin and hole locking mechanism, a magnet system, a lock, a clip, or any other type of securement that one of ordinary skill would consider. It should be noted that a securement means 106 may not be necessary for a wearable device 100 to be secured to a user. For example, a wearable device 100 may be secured to a user with a strap which is then tied around the user's wrist or other suitable appendage.

A button 108 may be provided on the wearable device 100 to allow for the user to interact with the wearable device 100 and for the user to provide a form of input into the wearable device 100. For illustration purposes, one button 108 is shown on the wearable device 100 embodied in FIGS. 1-3. However, a wearable device 100 may have any number of buttons placed upon it to allow the user to further interact with the wearable device 100 to provide alternative inputs. It should also be noted that a button 108 may not be necessary for a user to interact with the wearable device 100. Instead, the wearable device 100 may contain a screen capable of taking inputs via the touch of the user or through voice commands of the user.

Figure 4:
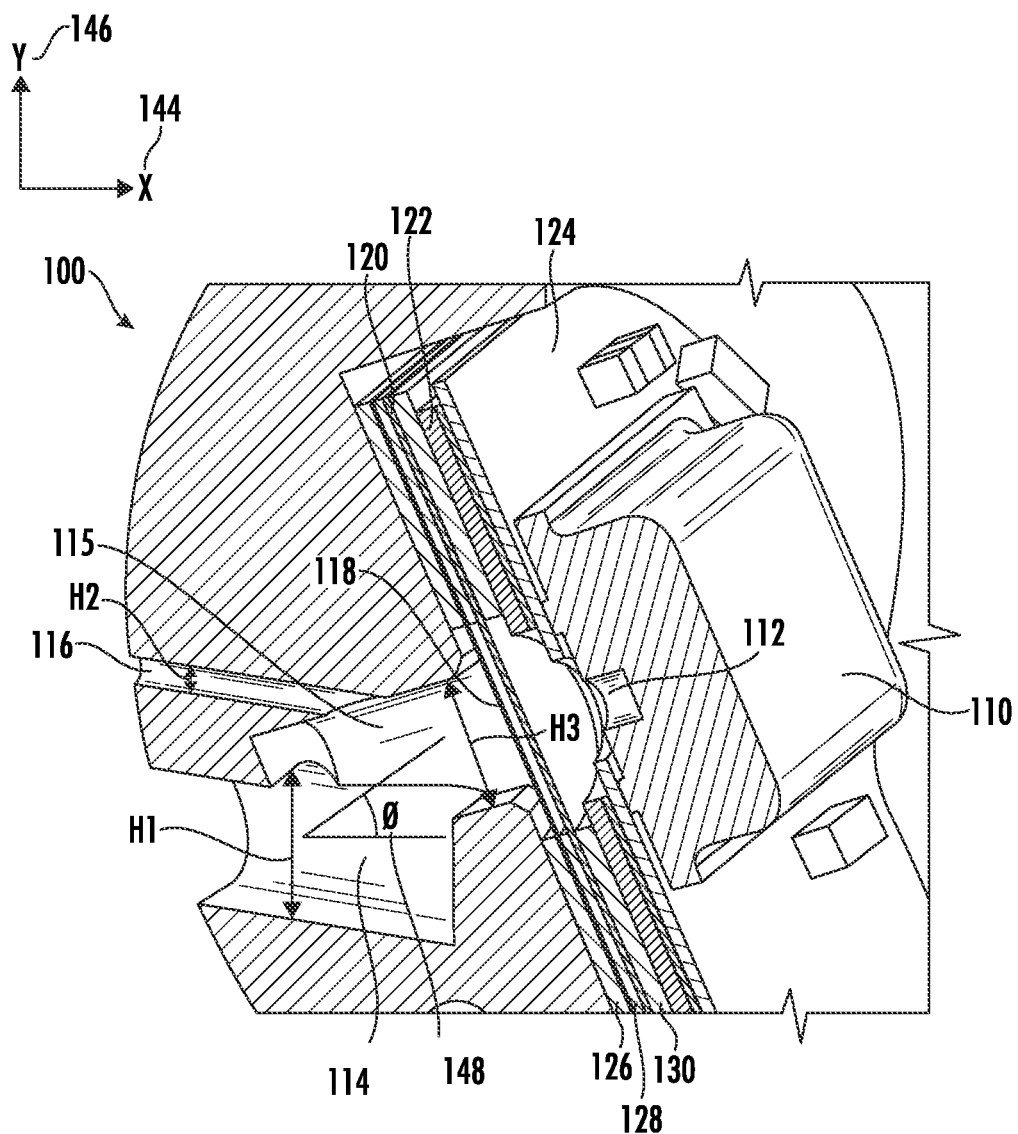
FIG. 4 provides a schematic drawing of wearable device according to the present disclosure, particularly illustrating a component, a base port, and a bypass port.
Figure 5:
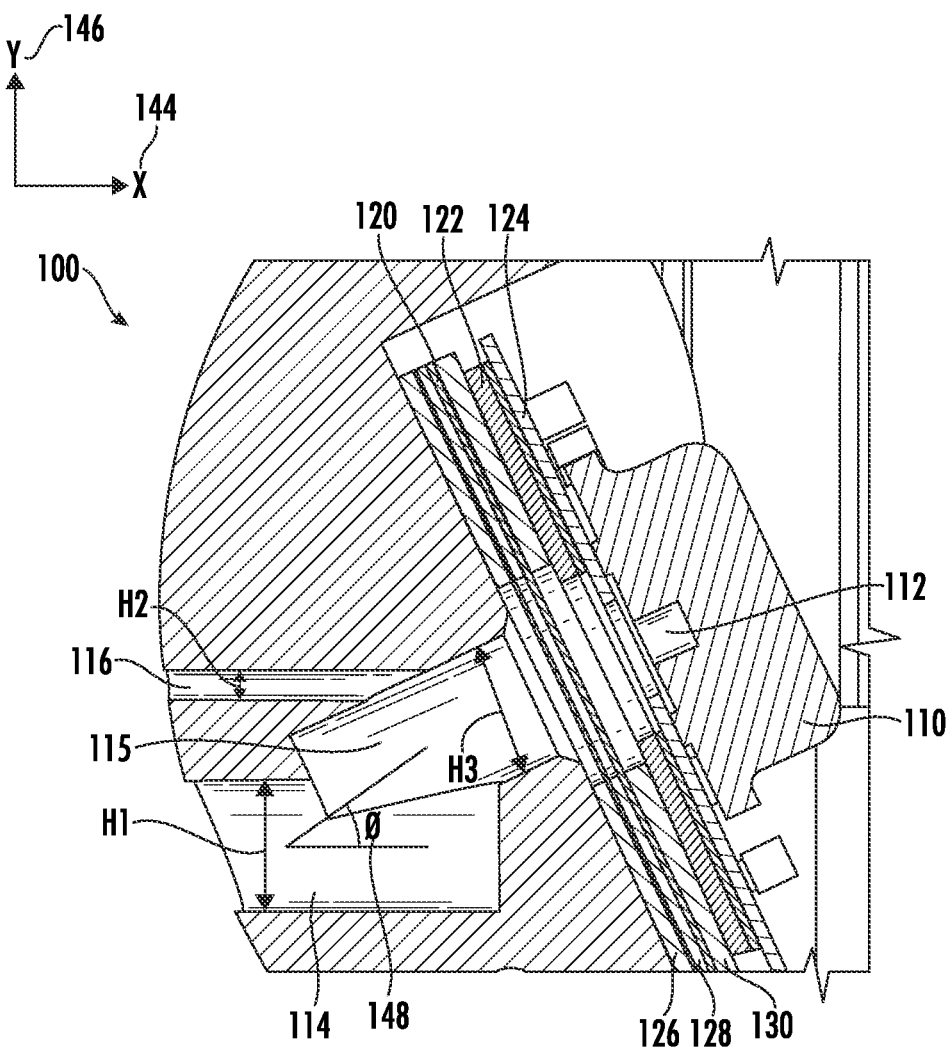
FIG. 5 illustrates a side view of the schematic drawing of FIG. 2 according to the present disclosure.
Figure 6:
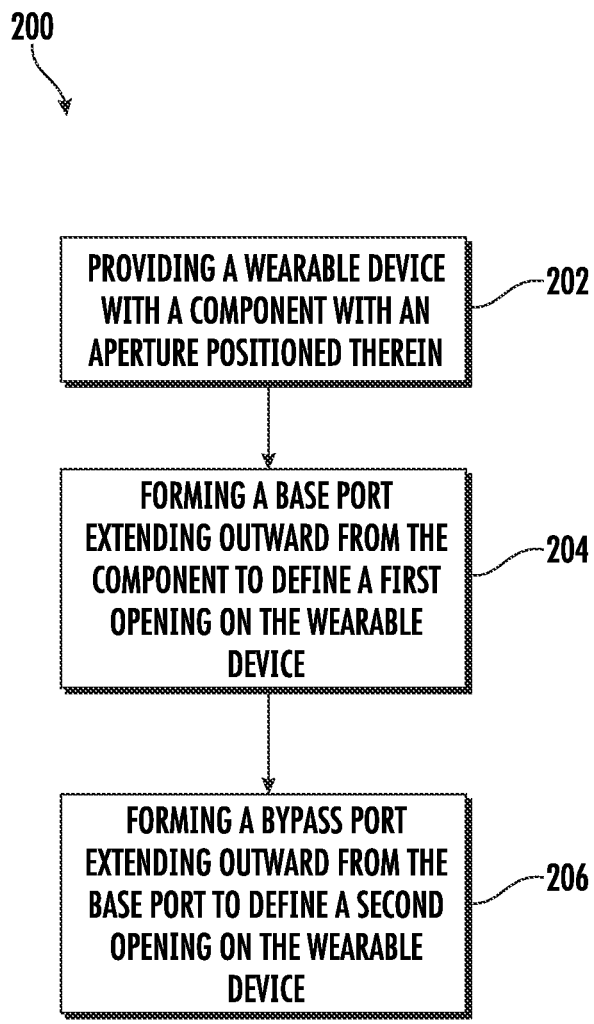
FIG. 6 shows a flow chart illustrating a method of manufacturing the wearable device of FIGS. 4-5, according to the present disclosure.

FIGS. 4 and 5 illustrates a schematic drawing of an embodiment of the wearable device 100 according to the present disclosure. In FIGS. 4 and 5, the wearable device 100 includes a component 110, an aperture 112 of the component 110, a base port 114, a bypass port 116, a fluid impermeable membrane 118, a backing mesh 120, a stiffener 122, a circuit board 124, a first adhesive layer 126, a second adhesive layer 128, and a third adhesive layer 130. Without intending to limit the present disclosure to a particular configuration, the base port 114 may be located on a side 136 (see FIG. 1) or 138 (not shown) of the wearable device 100. The circuit board 124 may be located within the wearable device 100. The component 110 with an aperture 112 may be located within the wearable device 100 atop the circuit board 124. The stiffener 122 may be located beneath the circuit board 124, while the third adhesive layer 130 may be located beneath the stiffener 122. Further, the backing mesh 120 may be located beneath the third adhesive layer 130, and, the second adhesive layer 128 may be located beneath the backing mesh 120. Additionally, the first adhesive layer 126 may be located beneath the second adhesive layer 128. The base port 114 may extend inward into the wearable device 100 such that the base port 114 is adjacent to the aperture 112. Additionally, the bypass port 116 may be placed adjacent to the base port 114. Further, the fluid impermeable membrane 118 may be placed between the aperture 112 and the base port 114.

The component 110 may be any type of device which may require a pathway which extends outward outside the wearable device 100 or any type of component 110 which may be affected by fluids entering the wearable device 100 through a pathway extending out of the wearable device 100. For example, and without intending to be limiting, the component 110 may be a microphone or an altimeter.

Further, the component 110 may include an aperture 112 that allows for the component 110 to output a signal outside of the wearable device 100 such as a sound wave or series of sound waves or allow for the component 110 to take in a signal from outside the wearable device 100 such as atmospheric pressure. The connection of the aperture 112 to the external environment allowing for the intake or output of signals may be achieved through a base port 114 which can extend from the aperture 112 of the component 110 to a first opening on the wearable device 100. The base port 114 may be centered radially around the aperture 112 of the component 110 or, in the alternative, the base port 114 may be placed anywhere else in connection with the aperture 112 of the component 110.

However, providing a connection from within the wearable device 100 to the external environment via the base port 114 may also allow for fluids to be trapped within the wearable device 100. These fluids may be prevented from contacting the component 110 by providing a fluid impermeable membrane 118 between the base port 114 and the aperture 112 of the component 110, but fluids will remain trapped within the base port 114 which, as previously mentioned, provides for a connection to the environment external to the wearable device 100. To remedy this, a bypass port 116 may be placed on the wearable device 100. The bypass port 116 may extend outward from the base port 114 and provide for a second opening on the wearable device 100. Providing a second opening on the wearable device 100 allows for the influx of air resulting from atmospheric pressure to enter the wearable device 100. The air flowing into the wearable device 100 as a result of atmospheric pressure can create a suction pressure, which, in turn, allows for the expulsion of fluids trapped within the base port 114 of the wearable device 100. Further, by providing a bypass port 116, evacuation of fluids from the base port 114 may be achieved passively and without the input of the user. Alternatively, the evacuation of fluids may further be enhanced by combining the features of a base port 114 and bypass port 116 with other types of means of evacuating fluids from a base port 114 which does require the input of a user or an active means which forces out fluids from a base port 114.

For example, unlike passive means as discussed in the present disclosure, active means of forcing out fluids from a base port may include having the component project sound waves into the base port thereby increasing the pressure within the base port sufficient enough to create a suction pressure to expel the fluids outside of the base port. Active means may also include any other means of utilizing a feature within the wearable device to actively increase the pressure within the base port such that a suction pressure is created capable of expelling fluids from the base port.

The base port 114 may also have a height H1 and the bypass port 116 may have a height H2. The height H1 of the base port 114 may be greater than or equal to about 0.5 millimeters (mm), such as 0.6 mm, such as 0.75 mm, such as 1 mm. By designing the base port 114 to have a height H1, the base port 114 may be large enough to allow the influx of air resulting from atmospheric pressure or signals such as sound waves. Moreover, the height H2 of the bypass port 116 may be less than or equal to about 0.3 mm, such as 0.25 mm, such as 0.15 mm, such as 0.1 mm, such as 0.075 mm, such as 0.05 mm, such as 0.025 mm, such as 0.01 mm. By designing the bypass port 116 to have a height of H2, the bypass port 116 may be small enough to prevent the entry or emission of signals such as sound waves, but may also be sufficiently large enough to allow for the influx of air resulting from atmospheric pressure such that a suction pressure is created within the base port 114 capable of expelling fluids trapped therein as a result.

Further, the height H2 of the bypass port 116 may be dependent upon the height H1 of the base port 114, or inversely, the height H1 may be dependent upon H2. For example, the height H2 may be less than the height H1. Specifically, the height H2 may be from about 10% to about 60% of the height H1, such as from about 15% to about 50% of the height H1, such as from about 20% to about 40% of the height H1. By designing the wearable device 100 to have the ratio between the height H1 and the height H2, the feature of the base port 114 allowing the influx of air resulting from atmospheric pressure or signals such as sound waves may be combined with the features of the bypass port 116 preventing the entry or emission of sound waves while also allowing the influx of air resulting from atmospheric pressure such that a suction pressure is created within the base port 114 capable of expelling fluids trapped therein.

In addition, the base port 114 may be placed anywhere that one of ordinary skill in the art would place the base port 114. For example, the base port 114 may be placed on a first side 136 of the wearable device 100, a second side 138 of the wearable device 100, a top 140 of the wearable device 100, a bottom 142 of the wearable device 100, a front 132 of the wearable device 100 or the display 102, or on the back 134 of the wearable device 100. Further, the bypass port 116 may also be placed anywhere that one of ordinary skill would place the bypass port 116 so long as it is possible for a connection to be formed between the base port 114 and the bypass port 116. For example, the bypass port 116 may be placed within a button 108 which is adjacent to the bypass port 116.

The fluid impermeable membrane 118 may be composed of a polymer such as rubber or polytetrafluoroethylene (PTF), a silicone, a metal, an adhesive such as a glue, or a combination thereof. Further, the fluid impermeable membrane 118 may also include a water resistant coating, an oil resistant coating, or a combination thereof. Moreover, the fluid impermeable membrane 118 may have a defined porosity. For example, the fluid impermeable membrane 118 may have pores with a selective size to allow for the entry of some fluids while preventing the entry of other fluids based on the molecular size of the fluids. More specifically, the pores may have a diameter ranging from about 0.01 to 1 micrometers (μm), such as 0.025 to 0.75 μm, such as about 0.05 to 0.5 μm.

The backing mesh 120 may be composed of a metal, an alloy, a polymer, a composite, a ceramic, or any combination thereof. Further, the backing mesh may have a thickness ranging from about 10 to 50 micrometers, such as about 20 to 40 μm, such as about 25 to 35 μm.

The stiffener 122 may be composed of an epoxy, a polyimide, or metals such as aluminum or stainless steel. Further, the stiffener may have a thickness ranging from about 0.05 to 1.5 millimeters (mm), such as about 0.1 to 1.25 mm, such as about 0.2 to 1 mm, such as about 0.5 to 0.75 mm.

The circuit board 124 may consist of a prepreg, a laminate, a foil, a solder mask, and finish. The prepreg may be composed of a glass or a composite and include a resin coating chosen from an epoxy, a polyimide, a polytetrafluoroethylene, or any other resin one of ordinary skill in the art would find to be suitable to manufacture a circuit board. The laminate may be composed of sheets of the prepreg with foil placed therein. The foil may be composed of a metal such as copper and may be placed atop the prepreg or laminate. The solder mask may be composed of an epoxy and may be placed over the prepreg or laminate and the coil. The finish may coat the attached prepreg or laminate, copper foil, and solder and may be composed of a metal such as nickel, gold, tin, lead, or silver. Further, the circuit board may have a thickness ranging from about 0.5 to 2.5 mm, such as about 0.75 to 2.25 mm, such as about 1 to 2 mm, such as about 1.25 to 1.75 mm.

The first adhesive layer 126, second adhesive layer 128, and third adhesive layer 130 may consist of a film which may be composed of polyethylene, chlorotrifluoroethylene, fluorinated ethylene propylene, or polytetrafluoroethylene. Further, one or all of the adhesive layers may have a thickness ranging from about 100 to 300 μm, such as about 125 to 275 μm, such as about 150 to 250 μm, such as about 100 to 200 μm.

Alternatively, the same features as discussed above with reference to a base port 114 and bypass port 116 configuration may also be achieved through the addition of an intermediary port. In an embodiment, the wearable device 100 may contain a base port 114, an intermediary port 115, and a bypass port 116. The intermediary port 115 may connect to the aperture 112 of the component 110 and extend outward providing a connection to both the base port 114 and the bypass port 116. The base port 114 may then extend outward to a first opening of the wearable device 100 while the bypass port 116 extends outward to a second opening of the wearable device 100.

In addition, the intermediary port 115 may be placed anywhere within the wearable device 100 so long as the intermediary port 115 is adjacent to the aperture 112 of the component 110 and capable of being in connection with the base port 114 and the bypass port 116. For example, the intermediary port 115 may be centered radially around the aperture 112 of the component 110. Further, in addition to the intermediary port 115 having a position in relation to the aperture 112 of the component 110, the intermediary port may have a predetermined angle 148 from which the intermediary port 115 extends from the base port 114. More specifically, if the base port 114 is formed at an x-axis 144 for an x-y plane and the y-axis 146 is placed 90 degrees from the x-axis 144, the intermediary port 115 may be placed at an angle 148 ranging from about 10 to about 80 degrees relative to the base port 114, such as from about 20 degrees to about 70 degrees relative to the base port 114, such as from about 25 degrees to about 65 degrees relative to the base port 114, such as from about 30 degrees to about 60 degrees relative to the base port 114.

Additionally, the intermediary port 115 may have a height H3. The height H3 may be greater than or equal to about 0.3 mm, such as 0.4 mm, such as 0.5 mm, such as 0.6 mm, such as 0.8 mm. By designing the intermediary port 115 to have a height H3, the base port is capable acting as a medium for pressure to flow through from the bypass port 116 into the base port 114 such that a suction pressure is created sufficient to expel fluids from the base port 114.

Moreover, the height of H3 of the intermediary port 115 may be dependent upon the height H1 of the base port 114, or inversely, the height H1 may be dependent upon H3. For example, the height H3 may be less than, equal to, or greater than H1. In particular, the height H3 may be from about 50% to about 150% of the height H1, such as from about 75% to about 125% of the height H1, such as from about 90% to about 110% of the height H1. By designing the wearable device 100 to have the ratio between the height H1 and the height H3, the intermediary port 115 is capable of acting as a medium between the base port 114 and the bypass port 116 while also not preventing the base port 114 from allowing influx of air resulting from atmospheric pressure or signals such as sound waves or the bypass port 116 from blocking the entry or emission of signals such as sound waves while allowing influx of air resulting from atmospheric pressure.

One benefit of providing an intermediary port 115 is the ease of manufacturing a wearable device 100 with a base port 114 and a bypass port 116. This benefit is achieved because one manufacturing a wearable device 100 according to the present disclosure may be able to angle the intermediary port 115 into a place that would otherwise not be easily as accessible with a base port 114 and a bypass port 116 alone enabling a broader amount of possible places a component 110 may be placed within the wearable device 100 while still forming a pathway with the external environment. Moreover, by using an intermediary port 115, simpler tools may be used to bore holes into the wearable device 100. For example, if a manufacturer wishes to place the component 110 at an angle from the base port 114, the manufacturer may drill a base port 114 into the wearable device 100 and then to reach the component 110 which has been placed at an angle from the base port 114, drill another hole at an angle toward the component 110 into the base port 114 forming the intermediary port 115. By creating an intermediary port 115 in this manner, a manufacturer who wishes to create a pathway from the base port 114 to the component 110 placed at an angle would not need to use a tool capable of drilling holes at an angle and may instead use a simpler tool which is only capable of drilling holes linearly. Further, another benefit that may be achieved by including an intermediary port 115 is that the component 110 may be placed in a greater number of positions as a result of the base port 114 in combination with the intermediary port 115 being able to reach a greater number of positions.

FIG. 5 shows a flowchart that illustrates a method 200 of manufacturing a wearable device capable of evacuating fluids. The method 200 includes step 202, which involves providing or obtaining a wearable device with a component with an aperture positioned therein. Step 204 involves forming a base port extending outward from the component to define a first opening on the wearable device. Step 206 involves forming a bypass port extending outward from the base port to define a second opening on the wearable device. The method 200 can include any additional steps that would be understood by one of ordinary skill in the art to manufacture a wearable device capable of evacuating fluids as described in detail above.

While various embodiments of the present disclosure have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied, alone or in some combination, to one or more of the other embodiments of the disclosure, whether or not such embodiments are described, and whether or not such features are presented as being a part of a described embodiment. Thus, the breadth and scope of the present disclosure should not be limited by any of the above-described exemplary embodiments.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like: the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term includes should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the present disclosure, but instead as merely intended to highlight alternative or additional features that may or may not be utilized in a particular embodiment of the present disclosure. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"): the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

All of the features disclosed in this specification (including any accompanying exhibits, claims, abstract and drawings), and/or all of the steps of any method or process so disclosed, may be combined in any combination, except combinations where at least some of such features and/or steps are mutually exclusive. The disclosure is not restricted to the details of any foregoing embodiments. The disclosure extends to any novel one, or any novel combination, of the features disclosed in this specification (including any accompanying claims, abstract and drawings), or to any novel one, or any novel combination, of the steps of any method or process so disclosed.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A wearable device capable of passively evacuating fluids, the wearable device comprising:
    a component, wherein the component has an aperture;
    a base port, wherein the base port extends outward from the aperture of the component to define a first opening on the wearable device; and
    a bypass port, wherein the bypass port extends outward from the base port to define a second opening on the wearable device, wherein the base port and the first opening have a first height and the bypass port and the second opening have a second height, wherein the second height is less than the first height, wherein the second height is 10% to 60% of the first height, wherein the first height extends from the aperture of the component to the first opening, wherein the second height extends from the base port to the second opening.

2. The wearable device of claim 1, wherein the component comprises a microphone, an altimeter, or a combination thereof.

3. The wearable device of claim 1, wherein the wearable device further comprises a fluid impermeable membrane positioned adjacent the aperture.

4. The wearable device of claim 1, wherein the first height is greater than or equal to 0.5 millimeters (mm).

5. The wearable device of claim 1, wherein second height is less than 0.3 millimeters (mm).

6. The wearable device of claim 1, wherein the second opening of the bypass port is positioned on a button of the wearable device.

7. The wearable device of claim 1, wherein the wearable device further comprises an intermediary port, wherein the intermediary port extends outwardly from the aperture of the component, further wherein the base port and the bypass port extend outwardly from the intermediary port to define the first opening and the second opening, wherein the intermediary port is centered radially around the aperture of the component.

8. The wearable device of claim 7, wherein the intermediary port is placed at an angle relative to the base port, wherein the angle relative to the base port is 10 degrees to 80 degrees.

9. A method of manufacturing a wearable device capable of passively evacuating fluids, the method comprising:
    providing a wearable device, wherein the wearable device has a component with an aperture therein;
    forming a base port, wherein the base port extends outward from the aperture of the component to define a first opening on the wearable device; and
    forming a bypass port, wherein the bypass port extends outward from the base port to define a second opening on the wearable device, wherein the base port and the first opening have a first height and the bypass port and the second opening have a second height, wherein the second height is less than the first height, wherein the second height is 10% to 60% of the first height, wherein the first height extends from the aperture of the component to the first opening, wherein the second height extends from the base port to the second opening.

10. The method of claim 9, wherein the component comprises a microphone, an altimeter, or a combination thereof.

11. The method of claim 9, wherein the wearable device further comprises a fluid impermeable membrane positioned adjacent the aperture.

12. The method of claim 9, wherein the first height is greater than or equal to 0.5 millimeters (mm).

13. The method of claim 9, wherein the second height is less than 0.3 millimeters (mm).

14. The method of claim 9, wherein the second opening of the bypass port may be positioned on a button of the wearable device.

15. The method of claim 9, wherein the method further comprises forming of an intermediary port, wherein the intermediary port extends outwardly from the component, further wherein the base port and the bypass port extends outwardly from the intermediary port to define the first opening and the second opening.

16. The method of claim 15, wherein the intermediary port is centered radially around the aperture of the component.

17. The method of claim 15, wherein the intermediary port is placed at an angle relative to the base port, wherein the angle relative to the base port is 10 degrees to 80 degrees.

18. A wearable device capable of passively evacuating fluids, the wearable device comprising:
    a component, wherein the component has an aperture;
    a base port, wherein the base port extends outward from the aperture of the component to define a first opening on the wearable device; and a bypass port, wherein the bypass port extends outward from the base port to define a second opening on the wearable device, wherein the base port and the first opening have a first height and the bypass port and the second opening have a second height, wherein the second height is less than the first height, wherein the first height is greater than or equal to 0.5 millimeters (mm) and the second height is less than 0.3 mm.

19. The wearable device of claim 1, wherein the fluid impermeable membrane comprises a pores having a diameter ranging from about 0.01 to 1 micrometers (μm), such as 0.025 to 0.75 μm, such as about 0.05 to 0.5 μm.

* * * * *